(12) United States Patent
Inoue et al.

(10) Patent No.: US 6,787,820 B2
(45) Date of Patent: Sep. 7, 2004

(54) HETERO-JUNCTION FIELD EFFECT TRANSISTOR HAVING AN INGAAIN CAP FILM

(75) Inventors: Kaoru Inoue, Otsu (JP); Yoshito Ikeda, Ibaraki (JP); Hiroyuki Masato, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 36 days.

(21) Appl. No.: 10/059,226

(22) Filed: Jan. 31, 2002

(65) Prior Publication Data

US 2002/0139995 A1 Oct. 3, 2002

(30) Foreign Application Priority Data

Mar. 27, 2001 (JP) .......................... 2001-090490

(51) Int. Cl.[7] .................. H01L 29/06; H01L 31/0328; H01L 21/338
(52) U.S. Cl. .................. 257/192; 257/21; 257/24; 257/27; 257/194; 257/195; 257/196; 438/167; 438/172; 438/285; 438/571; 438/590
(58) Field of Search .................. 257/192, 194–196, 257/20, 24, 27, 280–284; 438/167, 172, 285, 571, 590

(56) References Cited

U.S. PATENT DOCUMENTS 5,192,987 A    3/1993  Khan et al.
6,064,082 A    5/2000  Kawai et al.
2001/0040247 A1 * 11/2001 Ando et al. .................. 257/192

FOREIGN PATENT DOCUMENTS

EP    0 381 396        8/1990
WO    WO 00/65663      11/2000

OTHER PUBLICATIONS

Takashi Egawa, et al., "Characterizations of Recessed Gate AlGaN/GaN HEMTs on Sapphire", IEEE Transaction of Electron Devices, vol. 48, No. 3, Mar. 2001.
T. N. Oder, et al., "Photoresponsivity of Ultraviolet Detectors on $In_xAl_yGA_{1-x-y}N$ Quaternary Alloys", Applied Physics Letters, vol. 77, No. 6, Aug. 7, 2000.
Khan, et al., "Piezoelectric Doping in AlInGaN/GaN Heterostructures", Appl. Phys. Lett., vol. 75, No. 18, Nov. 1, 1999.

* cited by examiner

Primary Examiner—Donghee Kang
(74) Attorney, Agent, or Firm—McDermott Will & Emery LLP

(57) ABSTRACT

A semiconductor device includes an AlGaN film formed on a GaN film on a substrate, a gate electrode formed on the AlGaN film, and source and drain electrodes formed on either side of the gate electrode on the AlGaN film. An n-type $In_xGa_yAl_{1-x-y}N$ film is interposed between the source and drain electrodes and the AlGaN film. Alternatively, the semiconductor device includes an n-type $In_xGa_yAl_{1-x-y}N$ film formed on a GaN film on a substrate, a gate electrode formed on the $In_xGa_yAl_{1-x-y}N$ film, and source and drain electrodes formed on either side of the gate electrode on the $In_xGa_yAl_{1-x-y}N$ film.

4 Claims, 4 Drawing Sheets

HETERO-JUNCTION FIELD EFFECT TRANSISTOR HAVING AN INGAAIN CAP FILM

BACKGROUND OF THE INVENTION

The present invention relates to field effect transistors (FETS) using a hetero-structure of nitride semiconductors represented by the general formula $In_xGa_yAl_{1-x-y}N$ (with $0 \leq x \leq 1$, $0 \leq y \leq 1$, $0 \leq x+y \leq 1$).

Semiconductors including gallium nitride, such as gallium nitride (GaN), aluminum gallium nitride (AlGaN), indium gallium nitride (InGaN), and indium aluminum gallium nitride (InAlGaN), have a high dielectric breakdown electric field strength, high thermal conductivity, and high saturated electron drift velocity, for example, so they are preferred as materials for high frequency power devices. More specifically, a so-called two-dimensional electron gas is formed in the heterojunction structure of an AlGaN film serving as the top layer and a GaN film serving as the bottom layer (hereinafter referred to as "AlGaN/GaN heterostructure"), by accumulating a high concentration of electrons near the heterojunction interface in the GaN film.

This two-dimensional electron gas exhibits high electron mobility because it is spatially separated from the donor impurities added to the AlGaN film. Consequently, the source resistance component can be reduced by using an AlGaN/GaN hetero-structure in field effect transistors.

The distance d from the gate electrode formed on the AlGaN/GaN hetero-structure to the two-dimensional electron gas is usually short at about several dozen nm, so even if the gate length Lg is short at about 100 nm, the ratio Lg/d (aspect ratio) of the gate length Ld to the distance d can be increased to about 5 to 10. Therefore, an excellent characteristic of AlGaN/GaN hetero-structures is that they make it easy to fabricate field effect transistors with little short channel effect and good saturation properties.

Additionally, in high electric field regions of about $1 \times 10^5$ V/cm, the two-dimensional electron gas in the AlGaN/GaN hetero-structure has at least twice the electron velocity of currently available AlGaAs/InGaAs hetero-structures, for example, and therefore its application as a high frequency transistor material in high frequency power devices is anticipated.

However, one problem in field effect transistors using AlGaN/GaN hetero-structures or GaN is that there may be instabilities in transistor operations, depending on the approach used to apply the gate voltage or drain voltage. More specifically, it has been reported that the drain current decreases for other than thermal reasons when the drain voltage is increased, and also that the drain current gradually decreases when the strength or frequency of signals applied as the gate voltage is increased.

Drain current is thought to decrease for the following reasons:

(1) Poor crystal quality in the AlGaN film of the AlGaN/GaN hetero-structure leads to deep energy levels in the AlGaN film caused by numerous defects, with the deep energy levels acting as electron trapping centers (electron traps).

(2) Numerous defects in the surfaces of the GaN and the AlGaN films cause deep energy levels that contribute to the trapping and releasing of electrons.

On the other hand, a method for reducing the drop in drain current is to form a GaN film doped with n-type impurities in high concentration as a cap layer on the AlGaN/GaN hetero-structure, that is, on the AlGaN film.

FIG. 4A is a cross-sectional view of a conventional semiconductor device, or more specifically, a field effect transistor, using an AlGaN/GaN structure with this cap layer.

As shown in FIG. 4A, a buffer layer 13 made of a GaN film, and an electron supply layer 14 made of an n-type AlGaN film, are sequentially formed on a substrate 11 made of sapphire or silicon carbide (SiC) via an AlN (aluminum nitride) film 12. A cap layer 15 made of an n-type GaN film covers the upper surface of the electron supply layer 14. A gate electrode 16 is formed on the electron supply layer 14 within a recessed portion provided in a predetermined region of the cap layer 15, and a source electrode 17 and a drain electrode 18 are formed on either side of the gate electrode 16 on the cap layer 15.

In this conventional semiconductor device, a high-concentration two-dimensional electron gas 19 is formed in the buffer layer 13 near the interface with the electron supply layer 14 so that the semiconductor device can be operated as a FET by controlling the concentration of the two-dimensional electron gas 19 with the voltage applied to the gate electrode 16. That is, the upper portion of the buffer layer 13 functions as a channel layer.

In this conventional semiconductor device, the cap layer 15 protects the surface of the electron supply layer 14, so that the formation of deep energy levels caused by defects in the surface of the electron supply layer 14 can be inhibited. As a result, fluctuations in the potential energy of the electrons (hereinafter referred to simply as "potential") caused by electrons being trapped and released at the surface of the electron supply layer 14 can be suppressed. At this time, adding n-type impurities to the GaN film serving as the cap layer 15 can increase the distance from the surface of the electron supply layer 14 to the two-dimensional electron gas 19, thereby lessening the effect that fluctuations in potential in the surface of the electron supply layer 14 have on the potential of the channel layer.

Conventional semiconductor devices, however, have drawbacks in that a reduction in drain current cannot be adequately prevented, and the contact resistance of the source electrode 17 and the drain electrode 18, which are ohmic electrodes, is increased.

SUMMARY OF THE INVENTION

In light of the above, it is an object of the present invention to reliably prevent a reduction in drain current so as to stabilize FET operations and to reduce the contact resistance of the ohmic electrodes in FETs using a hetero-structure semiconductor including GaN.

To achieve this object, the inventors assessed the problems with conventional semiconductor devices, namely, a first problem of inadequate prevention of a reduction in drain current, and a second problem of an increase in contact resistance of the ohmic electrodes.

As mentioned earlier, in order to reduce the effect that traps in the surface of the hetero-structure of a semiconductor including GaN have on operation of the FET, it is effective to increase the distance from the surface of the hetero-structure to the region in which the two-dimensional electron gas is formed, that is, to the channel layer of the FET. In other words, increasing this distance makes it possible to reduce the effect that fluctuations in the surface potential of the surface of the hetero-structure caused by the trapping and releasing of electrons have on the potential of the channel layer. However, in the case of an AlGaN/GaN hetero-structure, that is, when an AlGaN film is used as the electron supply layer, the AlGaN layer itself cannot be made thick for attaining this effect because the AlGaN film and the GaN film have different lattice constants.

Accordingly, in the conventional semiconductor device, the cap layer 15 made of the n-type GaN film is formed on the electron supply layer 14 made of the AlGaN film to achieve the above-described effect.

In assessing the first problem, the inventors found that in the conventional semiconductor device, the difference between the spontaneous polarization of the GaN film serving as the cap layer 15 and the spontaneous and piezo-electric polarization of the AlGaN film serving as the electron supply layer 14 results in a drop in electron concentration in the channel layer of the FET, thereby causing the first problem of inadequate prevention of the reduction in drain current.

Next, in assessing the second problem, the inventors found that in the conventional semiconductor device, a potential hill caused by the above difference in polarization between the GaN film and the AlGaN film is formed at the interface between the cap layer 15 and the electron supply layer 14, because an ordinary hetero-structure in which the surface is a c face of group III atoms is used as the AlGaN/GaN hetero-structure, thereby resulting in the second problem of increased contact resistance of the ohmic electrodes.

FIG. 4B is a diagram schematically illustrating the change in the potential energy of the electrons taken along the line A–A' of FIG. 4A.

As shown in FIG. 4B, the effective contact resistance at the portions of the source electrode 17 and the drain electrode 18 that substantially function as ohmic electrodes, increases when the source electrode 17 and the drain electrode 18 are formed on the cap layer 15, because a potential hill occurs at the junction portion between the cap layer 15 (n-type GaN film) and the electron supply layer 14 (n-type AlGaN film).

The present invention was conceived in light of the above findings. More specifically, a first semiconductor device according to the present invention includes a GaN film formed on a substrate, an AlGaN film formed on the GaN film, a gate electrode formed on the AlGaN film, and source and drain electrodes formed on either side of the gate electrode on the AlGaN film; wherein an n-type $In_xGa_yAl_{1-x-y}N$ film (wherein $0<x<1$, $0 \leq y \leq 1$, $0<x+y<1$) is formed between the source and drain electrodes and the AlGaN film.

According to this first semiconductor device, a source electrode and a drain electrode (hereinafter, also referred to as the source and drain electrodes) are formed on a hetero-structure of AlGaN/GaN, that is, on the AlGaN film, via an InGaAlN film (which can also be an InAlN film). Since the InGaAlN film has been doped with n-type impurities, the surface of the hetero-structure can be protected, so that it is possible to suppress the effect of deep energy levels caused by defects in the surface, thereby inhibiting fluctuations in the potential caused by the trapping and releasing of electrons at the surface. Also, by inserting the thick InAlGaN film, it is possible to increase the distance from the surface of the hetero-structure to the channel region, which is formed by the two-dimensional electron gas in the hetero-structure. Consequently, the effect that fluctuations in the potential at the surface of the hetero-structure have on the potential of the channel layer can be diminished, so a reduction in drain current can be reliably prevented, stabilizing the operation of the FET and increasing the output power of the FET.

According to this first semiconductor device, an InGaAlN film is used in place of the conventional GaN film as the cap layer of the hetero-structure, so it is possible to reduce the difference in polarization between the AlGaN film and the cap layer. Thus, the formation of a potential hill at the interface between the AlGaN film and the cap layer can be inhibited, so that it is possible to reduce the contact resistance of the ohmic electrodes when source and drain electrodes, which are ohmic electrodes, are formed on the cap layer. Consequently, the properties of the FET can be improved and the efficiency of the FET can be increased.

It is preferable that in the first semiconductor device, the composition of the $In_xGa_yAl_{1-x-y}N$ film is set so that the lattice constant of the $In_xGa_yAl_{1-x-y}N$ film and the lattice constant of the GaN film are substantially matching, and polarization occurring in the $In_xGa_yAl_{1-x-y}N$ film is equal to or larger than polarization occurring in the AlGaN film.

Thus, the InGaAlN film serving as the cap layer can be formed thickly, so the distance from the surface of the hetero-structure to the channel layer can be further increased to reliably lessen the effect that potential fluctuations in the surface of the hetero-structure have on the potential of the channel layer. Furthermore, it is possible to make the slope of the potential between the AlGaN film and the cap layer substantially constant, or to form a potential valley, so that the contact resistance of ohmic electrodes formed on the cap layer can be reliably decreased.

In this first semiconductor device, it is also possible to form an InGaN film or a layered film of an InGaN film and another GaN film as a channel layer between the GaN film and the AlGaN film.

A second semiconductor device according to the present invention includes a GaN film formed on a substrate; an n-type $In_xGa_yAl_{1-x-y}N$ film (wherein $0<x<1$, $0 \leq y<1$, $0<x+y<1$) formed on the GaN film; a gate electrode formed on the $In_xGa_yAl_{1-x-y}N$ film; and source and drain electrodes formed on either side of the gate electrode on the $In_xGa_yAl_{1-x-y}N$ film.

According to this second semiconductor device, the source and drain electrodes are formed on the hetero-structure of a GaN film and an n-type InGaAlN film (which can also be an InAlN film). Thus, the InGaAlN film can be formed thickly so as to increase the distance from the surface of the hetero-structure to the channel region formed in the hetero-structure by the two-dimensional electron gas. Consequently, the effect that fluctuations in the potential at the surface of the hetero-structure have on the potential of the channel layer can be reduced, and therefore a reduction in drain current can be reliably prevented, stabilizing FET operations and increase the output power of the FET.

According to this second semiconductor device, forming the InGaAlN film thick makes it unnecessary to provide a cap layer on the hetero-structure. Thus, there are no potential hills formed at the interface between the hetero-structure and the cap layer due to a difference in polarization between semiconductor layers, which is the case when for example a conventional GaN film is formed as a cap layer on an AlGaN/GaN hetero-structure. Consequently, the contact resistance of ohmic electrodes can be reduced even when source and drain electrodes, which are ohmic electrodes, are formed on the InGaAlN film, and therefore the FET properties and the efficiency of the FET can be improved.

It is preferable that in the second semiconductor device, the composition of the $In_xGa_yAl_{1-x-y}N$ film is set so that the lattice constant of the $In_xGa_yAl_{1-x-y}N$ film and the lattice constant of the GaN film are substantially matching.

Thus, a thick InGaAlN film can be reliably formed, so the effect that fluctuations in the potential at the surface of the hetero-structure have on the potential of the channel layer can be reliably reduced.

In the second semiconductor device, it is also possible to form an InGaN film or a layered film of an InGaN film and another GaN film to serve as a channel layer between the GaN film and the $In_xGa_yAl_{1-x-y}N$ film.

DETAILED DESCRIPTION OF THE INVENTION

First Embodiment

The following is a description of a semiconductor device according to the first embodiment of the present invention, with reference to the accompanying drawings.

Figure 1A:
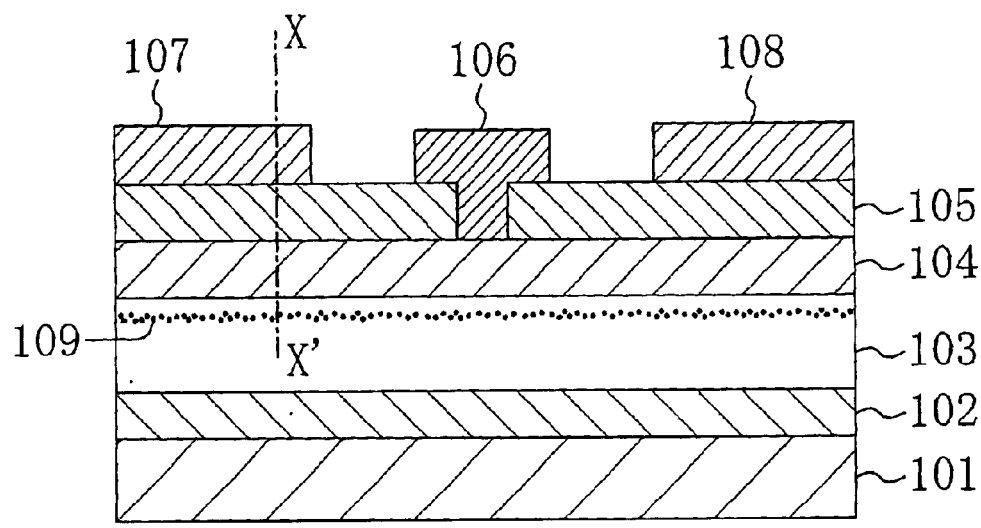
FIG. 1A is a cross-sectional view of the semiconductor device according to a first embodiment of the present invention.

FIG. 1A is a cross-sectional view of a semiconductor device, or more specifically, a field effect transistor (FET), according to the first embodiment.

As illustrated in FIG. 1A, a buffer layer 103 made of a GaN film of a thickness of about 2000 nm, and an electron supply layer 104 made of an n-type AlGaN film of a thickness of about 20 nm, are sequentially formed on a substrate 101 made of sapphire or silicon carbide (SiC) via an approximately 100 nm thick AlN film 102. The AlN composition ratio p in the AlGaN film serving as the electron supply layer 104, is about 0.15 to 0.5 (or put differently, the composition ratio of GaN in the AlGaN film is about 0.5 to 0.85), and n-type impurities such as silicon have been added to the AlGaN film at a concentration of about 2 to $4 \times 10^{18}/cm^3$, for example. A cap layer 105, which is made of an InGaAlN layer about 100 nm thick and to which n-type impurities like silicon have been added, covers the upper surface of the electron supply layer 104. A gate electrode 106 is formed on the cap layer 105 and within a recessed portion provided in a predetermined region of the cap layer 105, such that it is in contact with the electron supply layer 104, and a source electrode 107 and a drain electrode 108 are formed on the cap layer 105 on either side of the gate electrode 106.

It should be noted that in the first embodiment, the recessed portion that serves as the gate electrode formation region is formed by etching the cap layer 105 with a low energy dry etching device that uses chlorine gas, such that the gate length of the FET is about 1 $\mu$m. The gate electrode 106 is made by forming a layered film of nickel and gold on the cap layer 105, including the recessed portion, and then using a lift-off method to form the gate electrode from that layered film.

In the first embodiment, a high concentration two-dimensional electron gas 109 is formed in the buffer layer 103 near the interface with the electron supply layer 104, so that FET operation can be achieved by controlling the concentration of the two-dimensional electron gas 109 with the voltage applied to the gate electrode 106. This means that the upper portion of the buffer layer 103 functions as a channel layer.

The following is a description of the required conditions for the composition of the InGaAlN film, which serves as the cap layer 105.

The first condition is that the lattice constant of the c face of the InGaAlN film substantially matches the lattice constant of the GaN film, which serves as the buffer layer 103, so that the InGaAlN film can be made thick. For that, the fact that the lattice constant of $In_{0.18}Al_{0.82}N$ substantially matches with the lattice constant of GaN is exploited, and it is possible to use a film made from a mixed crystal of $In_{0.18}Al_{0.82}N$ and GaN, that is, a $(In_{0.18}Al_{0.82})_qGa_{1-q}N$ film (where 0<q<1), as the InGaAlN film. At this time, the electron affinity of the InGaAlN film is less than the electron affinity of the GaN film, so electrons accumulate on the channel layer side.

The second condition is that the polarization that occurs in the InGaAlN film is made equal to or larger than the polarization that occurs in the AlGaN film, so that a large potential hill is not allowed to occur at the interface between the InGaAlN film, which serves as the cap layer 105, and the AlGaN film, which serves as the electron supply layer 104, or more specifically, so that between the InGaAlN film and the AlGaN film the slope of the potential becomes substantially constant or a potential valley is formed. Consequently, there must be a limit added to the value of q in the $(In_{0.18}Al_{0.82})_qGa_{1-q}N$ film that satisfies the first condition. At this time, the lower limit of q depends on the value of the composition ratio p of AlN in the AlGaN film serving as the electron supply layer 104. With ordinarily used composition ratios p of AlN in the AlGaN film, the lower limit of the value q was calculated to be approximately 0.16 when p is 0.1, and approximately 0.47 when the lower limit of p is 0.3. This means that the lower limit of q can be thought of as approximately 1.5 times the composition ratio p of AlN in the AlGaN film serving as the electron supply layer 104.

Figure 1B:
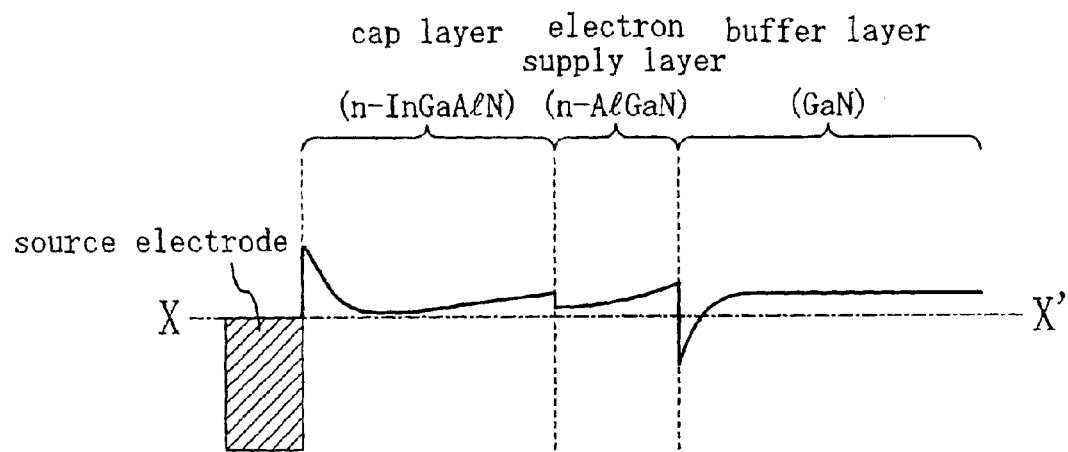
FIG. 1B is a diagram showing the change in potential energy of the electrons taken along the line X–X' in FIG. 1A.
Figure 1C:
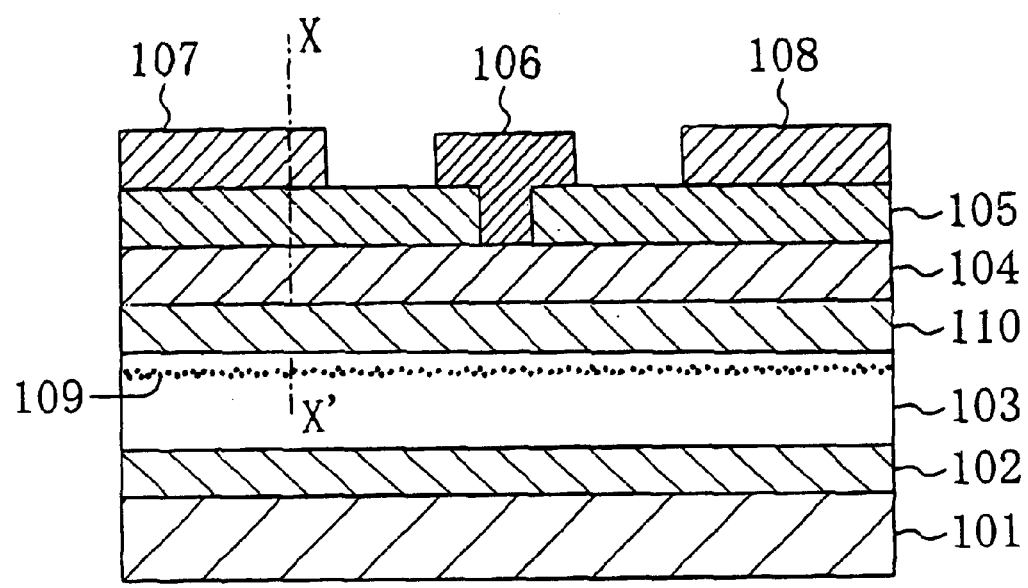
FIG. 1C is a cross-sectional view of a modified embodiment of the semiconductor device of the first embodiment of the present invention.

More specifically, in a FET that was experimentally manufactured with the first embodiment, a 20 nm thick AlGaN film was used as the electron supply film layer 104, the AlN composition ratio p in this AlGaN film was 0.2, and the amount of silicon dopant in this AlGaN film was $4 \times 10^{18}/cm^3$. To satisfy the first and second conditions, a 100 nm thick $(In_{0.18}Al_{0.82})_qGa_{1-q}N$ film was used as the cap layer 105, the value of q in the $(In_{0.18}Al_{0.82})_qGa_{1-q}N$ film is 1.5 times the value p at 0.3, and the amount of silicon dopant in the $(In_{0.18}Al_{0.82})_qGa_{1-q}N$ film is $2 \times 10^{18}/cm^3$. FIG. 1B shows the change in the potential energy of electrons taken along the line X–X' in FIG. 1A that is predicted for this case. As shown in FIG. 1B, it is expected that no large potential hill will form between the cap layer 105 (n-type InGaAlN film) and the electron supply layer 104 (n-type AlGaN film).

Figure 2:
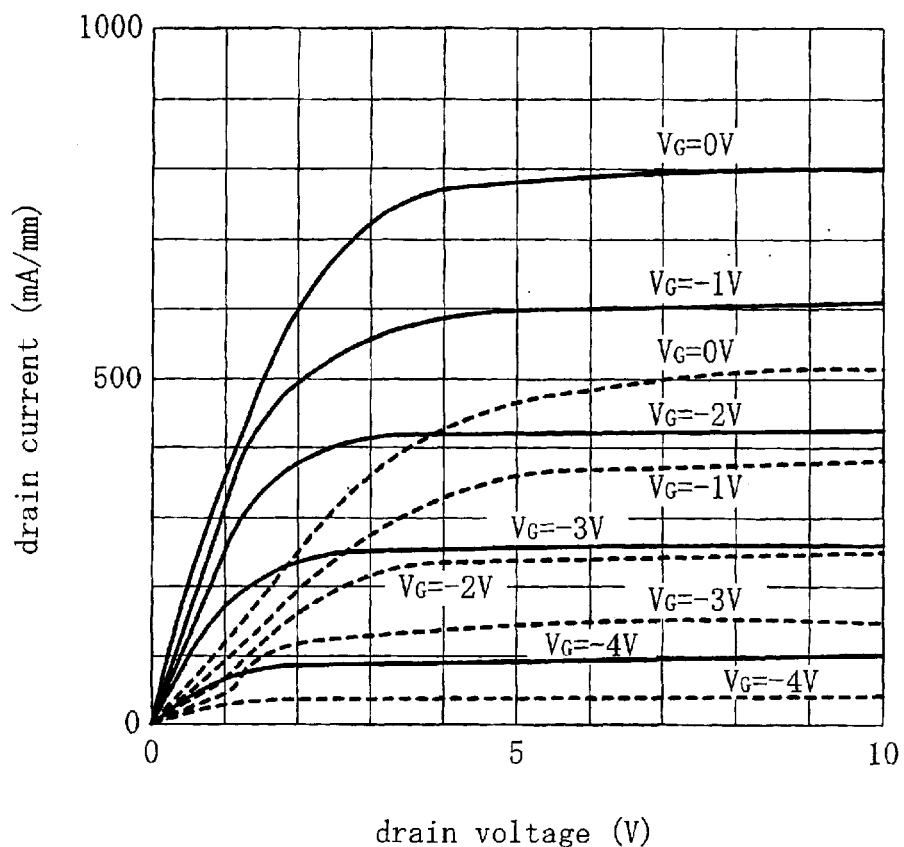
FIG. 2 is a diagram showing the voltage-current properties of the semiconductor device according to the first embodiment of the present invention.
Figure 4A:
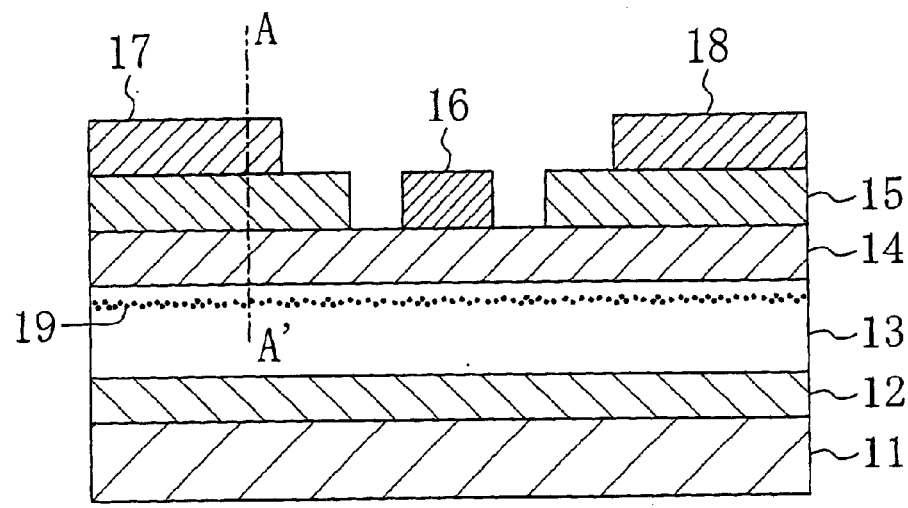
FIG. 4A is a cross-sectional view of a conventional semiconductor device.
Figure 4B:
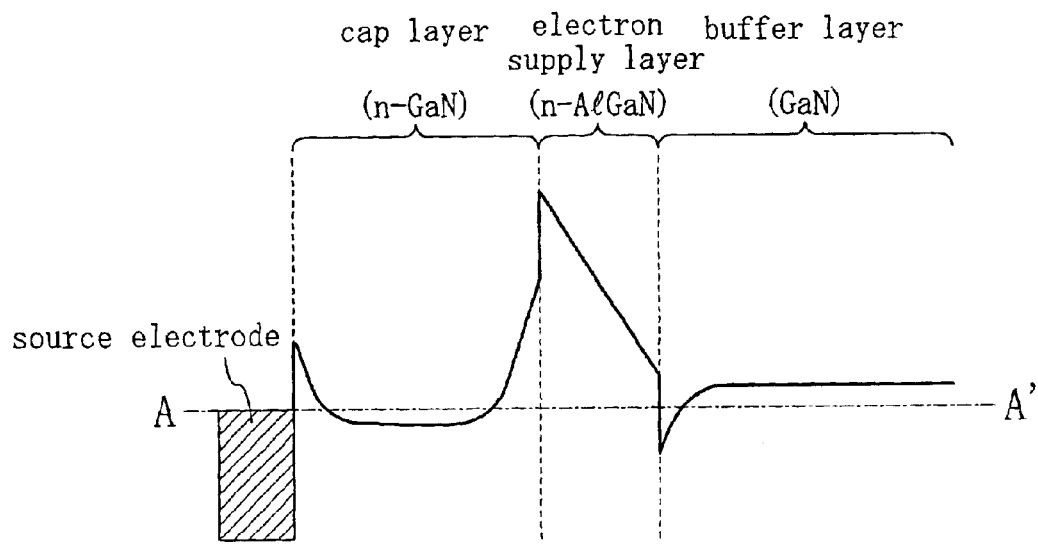
FIG. 4B is a diagram showing the change in potential energy of the electrons taken along the line A–A' in FIG. 4A.

FIG. 2 shows the voltage-current properties (solid lines) of the semiconductor device according to the first embodiment, that is, a FET with an InGaAlN film serving as a cap layer on an AlGaN/GaN hetero-structure. It should be noted that for reference, FIG. 2 also shows the voltage-current properties (broken lines) of the conventional example of a semiconductor device shown in FIG. 4A, that is, a FET with a GaN film as a cap layer on an AlGaN/GaN hetero-structure. The horizontal axis shows the drain voltage, and the vertical axis shows the drain current per gate width.

As shown in FIG. 2, when the gate voltage $V_G$ is 0V, the drain current of the first embodiment, in which an InGaAlN film is used as the cap layer, is about 800 mA/mm, whereas the drain current of the conventional example, in which a GaN film is used as the cap layer, is about 500 mA/mm. This means that in the first embodiment the drain current is more than 30% over that of the conventional example.

Furthermore, as shown in FIG. 2, in the first embodiment, the rise in drain current is relatively good even when the drain voltage is low, whereas in the conventional example, when the drain voltage is low, the rise in drain current is relatively poor, and the drain current does not rise linearly. For example, when the gate voltage $V_G$ is 0V, and when the knee voltage is defined as the drain voltage at which the drain current is saturated, then, as shown in FIG. 2, the knee voltage of the first embodiment is about 4V, whereas the knee voltage of the conventional example is about 6V or more. This means that in the first embodiment, an increase in contact resistance of the source and drain electrodes, that is, a non-linearity of the voltage-current curve resulting from degradation of the ohmic electrodes as in the conventional example cannot be observed, and the knee voltage is improved 2 V or more over the conventional example. These results correspond to the absence of a potential hill formed between the source/drain electrodes and the channel layer (more precisely, between the cap layer and the electron supply layer) in the first embodiment, whereas in the conventional example a potential hill is formed between the source/drain electrodes and the channel layer.

As described above, in the first embodiment, the source electrode 107 and the drain electrode 108 are formed on the AlGaN/GaN hetero-structure, that is, on the AlGaN film that serves as the electron supply layer 104, via the InGaAlN film, which serves as the cap layer 105. Since the InGaAlN film has been doped with n-type impurities, the surface of the hetero-structure can be protected, so the effect of deep energy levels resulting from defects in the surface can be inhibited, thereby suppressing fluctuations in the potential in the surface caused by electrons being trapped and released. Also, by inserting the thick InAlGaN film as the cap layer 105, the distance from the surface of the hetero-structure to the channel layer formed in the hetero-structure by the two-dimensional electron gas 109 can be increased. Consequently, the effect that potential fluctuations in the surface of the hetero-structure have on the potential of the channel layer can be diminished, so a reduction in drain current can be reliably prevented, thereby stabilizing FET operations and increasing the output power of the FET.

Additionally, the first embodiment uses an InGaAlN film as the cap layer 105 on the hetero-structure instead of the conventionally used GaN film, so the difference in polarization between the AlGaN film, which serves as the electron supply layer 104, and the cap layer 105 can be reduced. Thus, the formation of a potential hill at the interface of the AlGaN film and the cap layer 105 can be inhibited, so when the source electrode 107 and the drain electrode 108, which become ohmic electrodes, are formed on the cap layer 105, the contact resistance of the ohmic electrodes can be reduced. Consequently, the properties of the FET can be improved and the efficiency of the FET can be increased.

Furthermore, in the first embodiment, the composition of the InGaAlN film that serves as the cap layer 105 is set so that the lattice constant of the InGaAlN film and the lattice constant of the GaN film serving as the buffer layer 103 are substantially matching. Thus, the InGaAlN film can be formed thick, so the distance from the surface of the hetero-structure to the channel layer can be further increased, and the effect that potential fluctuations in the surface of the hetero-structure have on the potential of the channel layer can be reliably reduced.

Also, in the first embodiment, the composition of the InGaAlN film serving as the cap layer 105 is set so that the polarization occurring in the InGaAlN film is equal to or larger than the polarization occurring in the AlGaN film serving as the electron supply layer 104. Thus, between the AlGaN film and the cap layer 105 it is possible to make the slope of the potential substantially constant, or to form potential valleys, and therefore the contact resistance of the ohmic electrodes formed on the cap layer 105 can be reliably reduced.

In the first embodiment, when an $(In_{0.18}Al_{0.82})_q Ga_{1-q}N$ film is used as the cap layer 105, the value of q is set to a value that is 1.5 times the composition ratio p of the AlN in the AlGaN film serving as the electron supply layer 104, however, this restriction to the value of q is only an ideal, and actually a smaller value can be used as the value for q. This means that when q=0, the cap layer 105 becomes a conventional GaN film, and as previously mentioned, a large potential hill is formed between the source and drain electrodes and the channel layer. On the other hand, if for example a value that is about the same as p is used as the value of q, then the height of the potential hill can be kept significantly lower than when q=0, and thus the effect of a reduction in contact resistance of the ohmic electrodes can be expected.

In the first embodiment, the electron supply layer 104, which is made of an AlGaN film, is formed on the buffer layer 103, which is made of a GaN film, however, it is also possible that instead of this configuration, a film 110 comprising an InGaN thin film or a layered film of an InGaN thin film and a GaN thin film is formed between the buffer layer 103 and the electron supply layer 104 as a channel layer.

In the first embodiment, a sapphire substrate or a SiC substrate is used as the substrate 101, however, it is also possible that in the future a GaN substrate may be used as the substrate 101.

In the first embodiment, an InGaAlN film is used as the cap layer 105, however, there is no limitation to this, and for the cap layer 105 it is also possible to use a nitride semiconductor film represented by the general formula $In_x Ga_y Al_{1-x-y}N$ (wherein, 0<x<1, 0≦y<1, 0<x+y<1). This means that for the cap layer 105, instead of the InGaAlN film it is also possible to use an InAlN film, for example.

Second Embodiment

Referring to the accompanying drawings, the following is a description of a semiconductor device according to the second embodiment of the present invention.

Figure 3:
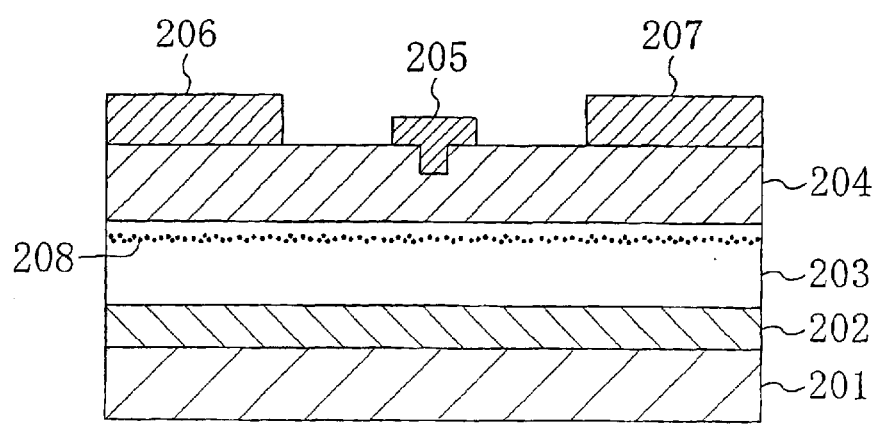
FIG. 3 is a cross-sectional view of the semiconductor device according to a second embodiment of the present invention.

FIG. 3 is a cross-sectional view of a semiconductor device, or more precisely a field effect transistor (FET), according to the second embodiment.

As shown in FIG. 3, a buffer layer 203 made of a GaN film of a thickness of about 2000 nm, and an electron supply layer 204 made of an n-type InAlGaN film of a thickness of about 100 nm, are sequentially formed on a substrate 201, which is made of sapphire or silicon carbide (SiC), via an AlN film 202 of a thickness of about 100 nm. A gate electrode 205 is formed on the electron supply layer 204 and within a recessed portion of about 80 nm depth provided in a predetermined region of the electron supply layer 204, and a source electrode 206 and a drain electrode 207 are formed on either side of the gate electrode 205 on the electron supply layer 204.

It should be noted that in the second embodiment, the recessed portion, which serves as the gate electrode formation region, is formed by selectively dry etching the electron supply layer 204.

In this second embodiment, a two-dimensional electron gas 208 with high concentration is formed in the buffer layer 203 near the interface with the electron supply layer 204, so the semiconductor device can be operated as a FET by controlling the concentration of the two-dimensional electron gas 208 with the voltage applied to the gate electrode 205. This means that the upper portion of the buffer layer 203 functions as a channel layer.

The second embodiment differs from the first embodiment (see FIG. 1A) in the following aspects: In the first embodiment, an InGaAlN film (cap layer 105) was formed on a GaN film (buffer layer 103) via an AlGaN film (electron supply layer 104), whereas in the second embodiment an InGaAlN film (electron supply layer 204) is formed directly onto a GaN film (buffer layer 203). Also, in the second embodiment there is no cap layer.

The following is a description of the conditions required for the composition of the InGaAlN film serving as the electron supply layer 204.

The first condition is that the lattice constant of the c face of the InGaAlN film substantially matches the lattice constant of the GaN film, which serves as the buffer layer 203, so that the InGaAlN film can be directly formed on the GaN film, and the InGaAlN film can be made thick. At this time, the difference in electron affinity between the GaN film, which serves as the channel layer of the FET, and the InGaAlN film (the electron affinity of the GaN film is larger than that of the InGaAlN film) is preferably about the same or larger than the difference in electron affinity between the GaN film and the AlGaN film when the AlGaN film is formed on the GaN film (the electron affinity of the GaN film is larger than that of the AlGaN film).

The second condition is that the polarization that occurs in the InGaAlN film is equal to or larger than the polarization that occurs in the AlGaN film, so that the InGaAlN film, which serves as the electron supply layer 204, has the same function as the AlGaN film serving as the electron supply layer 104 in the first embodiment.

To satisfy the first and second conditions, as mentioned in the first embodiment, an $(In_{0.18}Al_{0.82})_qGa_{1-q}N$ film (wherein 0<q<1) can be used as the InGaAlN film, and in contrast to the composition ratio p of the AlN in the AlGaN film serving as the electron supply layer 104 in the first embodiment, q should be selected so that $q \geq 1.5p$.

More specifically, in a FET that was experimentally manufactured with the second embodiment, an $In_{0.054}Ga_{0.7}Al_{0.246}N$ film (equivalent to a $(In_{0.18}Al_{0.82})_qGa_{1-q}N$ film with q=0.3) of 100 nm thickness was used as the electron supply layer 204, and the amount of Si dopants in the $In_{0.054}Ga_{0.7}Al_{0.246}N$ film was set to $4 \times 10^{18}/cm^3$. In this case, the semiconductor device according to the second embodiment, that is, the FET with a hetero-structure of InGaAlN/GaN, has voltage-current properties that are the same as the voltage-current properties of the semiconductor device according to the first embodiment, that is, the FET with an InGaAlN film as a cap layer on an AlGaN/GaN hetero-structure, shown by the solid line in FIG. 2. This means that in the second embodiment, the drain current was significantly increased over the conventional example. Furthermore, in the second embodiment, there was non-linearities of the voltage-current properties caused by degradation of the ohmic electrodes like in the conventional example could not be observed, and the knee voltage was significantly improved over that of the conventional example.

As explained above, according to the second embodiment, the source electrode 206 and the drain electrode 207 are formed on the hetero-structure of a GaN film, which serves as the buffer layer 203, and an n-type InGaAlN film, which serves as the electron supply layer 204. Thus, the InGaAlN film is formed thickly, making it possible to increase the distance from the surface of the hetero-structure to the channel layer, which is formed in the hetero-structure by the two-dimensional electron gas 208. Consequently, the effect that fluctuations in the potential at the surface of the hetero-structure have on the potential of the channel layer is reduced, so a reduction in drain current can be reliably prevented, stabilizing FET operations and increasing the output power of the FET.

According to the second embodiment, forming a thick InGaAlN film makes it unnecessary to provide a cap layer on the hetero-structure. Thus, no potential hill is formed at the interface between the hetero-structure and the cap layer due to differences in polarization between the semiconductor layers, as was the case when a conventional GaN film was formed as a cap layer on a hetero-structure of AlGaN/GaN. Consequently, when the source electrode 206 or the drain electrode 207, which become ohmic electrodes, are formed on the electron supply layer 204 made of the InGaAlN film, contact resistance of the ohmic electrodes can be reduced, so that the properties of the FET can be improved and the efficiency of the FET can be increased.

According to the second embodiment, the composition of the InGaAlN film, which serves as the electron supply layer 204, is set so that the lattice constant of the InGaAlN film and the lattice constant of the GaN film, which is the buffer layer 203, are substantially matching. Thus, a thick InGaAlN film can be reliably formed, so the effect that fluctuations in the potential in the surface of the hetero-structure have on the potential of the channel layer can be reliably reduced.

It should be noted that in the second embodiment, when an $(In_{0.18}Al_{0.82})_qGa_{1-q}N$ film is used as the electron supply layer 204, the value of q is set to a value that is 1.5 times the composition ratio p of the AlN in the AlGaN film serving as the electron supply layer 104 in the first embodiment, however, this restriction to the value of q is only an ideal, and actually a smaller value can be used as the value for q.

Furthermore, in the second embodiment, the electron supply layer 204, which is made of an InGaAlN film, is formed on the buffer layer 203, which is a GaN film, however, instead of this configuration, it is also possible to form an InGaN thin film or layered film of an InGaN thin film and a GaN thin film as a channel layer between the buffer layer 203 and the electron supply layer 204.

In the second embodiment, a sapphire substrate or a SiC substrate is used as the substrate 201, however, it is also possible that in the future a GaN substrate may be used as the substrate 201.

In the second embodiment, an InGaAlN film is used for the electron supply layer 204, however, there is no limitation to this, and it is also possible to use a nitride semiconductor film represented by the general formula of $In_xGa_yAl_{1-x-y}N$ (with 0<x<1, 0≦y<1, 0<x+y<1) for the electron supply layer 204. This means that it is also possible to use for example an InAlN film in place of the InGaAlN film as the electron supply layer 204.

The invention may be embodied in other specific forms without departing from the spirit or essential characteristics thereof. The embodiments disclosed in this application are to be considered in all respects as illustrative and not restrictive, the scope of the invention being indicated by the appended claims rather than by the foregoing description.

All changes that come within the meaning and range of equivalency of the claims are intended to be embraced therein.

What is claimed is:

1. A semiconductor device, comprising:

a GaN film formed on a substrate;

an AlGaN film formed on the GaN film;

a gate electrode formed on the AlGaN film; and source and drain electrodes formed on either side of the gate electrode on the AlGaN film;

wherein an n-type $In_xGa_yAl_{1-x-y}N$ cap film (wherein $0<x<1$, $0<y<1$, $0x+y<1$) is formed between the source and drain electrodes and the AlGaN film.

2. The semiconductor device according to claim 1, wherein an InGaN film, or a layered film of an InGaN film and another GaN film, is formed between the GaN film and the AlGaN film.

3. A semiconductor device comprising:

a GaN film formed on a substrate;

an AlGaN film formed on the GaN film;

a gate electrode formed on the AlGaN film; and source and drain electrodes formed on either side of the gate electrode on the AlGaN film;

wherein an n-type $In_xGa_yAl_{1-x-y}N$ film (wherein $0<x<1$, $0<y<1$, $0<x+y<1$) is formed between the source and drain electrodes and the AlGaN film, and wherein the composition of the $In_xGa_yAl_{1-x-y}N$ film is set so that the lattice constant of the $In_xGa_yAl_{1-x-y}N$ film and the lattice constant of the GaN film are substantially matching, and polarization occurring in the $In_xGa_yAl_{1-x-y}N$ film is equal to or larger than polarization occurring in the AlGaN film.

4. The semiconductor device according to claim 3, wherein an InGaN film, or a layered film of an InGaN film and another GaN film, is formed between the GaN film and the AlGaN film.

* * * * *

UNITED STATES PATENT AND TRADEMARK OFFICE
CERTIFICATE OF CORRECTION

PATENT NO.   : 6,787,820 B2
DATED        : September 7, 2004
INVENTOR(S)  : Kaoru Inoue et al.

It is certified that error appears in the above-identified patent and that said Letters Patent is hereby corrected as shown below:

<u>Title page, Item [54] and Column 1, Lines 1-3,</u>
Title, change from "HETERO-JUNCTION FIELD EFFECT TRANSISTOR HAVING AN INGAAIN CAR FILM" to -- HETERO-JUNCTION FIELD EFFECT TRANSISTOR HAVING AN InGnAlN CAP FIELD --

Signed and Sealed this

Third Day of May, 2005

JON W. DUDAS
*Director of the United States Patent and Trademark Office*